(12) United States Patent
Kanamura et al.

(10) Patent No.: US 8,895,378 B2
(45) Date of Patent: Nov. 25, 2014

(54) COMPOUND SEMICONDUCTOR DEVICE AND METHOD OF MANUFACTURING THE SAME

(71) Applicant: Fujitsu Limited, Kawasaki-shi, Kanagawa (JP)

(72) Inventors: Masahito Kanamura, Kawasaki (JP); Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/050,629

(22) Filed: Oct. 10, 2013

(65) Prior Publication Data
US 2014/0038372 A1 Feb. 6, 2014

Related U.S. Application Data

(60) Division of application No. 13/276,830, filed on Oct. 19, 2011, now Pat. No. 8,581,261, which is a continuation of application No. PCT/JP2009/057854, filed on Apr. 20, 2009.

(51) Int. Cl.
| | |
|---|---|
| *H01L 29/66* | (2006.01) |
| *H01L 21/02* | (2006.01) |
| *H01L 29/10* | (2006.01) |
| *H01L 29/423* | (2006.01) |
| *H01L 29/778* | (2006.01) |
| H01L 29/20 | (2006.01) |

(52) U.S. Cl.
CPC ...... *H01L 29/66462* (2013.01); *H01L 21/0217* (2013.01); *H01L 21/02274* (2013.01); *H01L 29/1029* (2013.01); *H01L 29/2003* (2013.01); *H01L 29/42316* (2013.01); *H01L 29/7787* (2013.01)
USPC ............. 438/172; 438/285; 438/590; 257/76; 257/194; 257/E21.403

(58) Field of Classification Search
CPC ................... H01L 21/02274; H01L 21/0217; H01L 29/1029; H01L 29/7787; H01L 29/66462; H01L 29/2003
USPC ............. 438/172, 285, 590; 257/76, 194, 192
See application file for complete search history.

(56) References Cited

U.S. PATENT DOCUMENTS

| | | | |
|---|---|---|---|
| 5,686,325 | A | 11/1997 | Moriuchi et al. |
| 7,002,189 | B2 | 2/2006 | Kikkawa |

(Continued)

FOREIGN PATENT DOCUMENTS

| | | |
|---|---|---|
| JP | 4-282841 A | 10/1992 |
| JP | 8-162476 A | 6/1996 |

(Continued)

OTHER PUBLICATIONS

International Search Report of PCT/JP2009/057854, mailing date Jul. 14, 2009.

(Continued)

*Primary Examiner* — Thinh T Nguyen
(74) *Attorney, Agent, or Firm* — Westerman, Hattori, Daniels & Adrian, LLP

(57) ABSTRACT

Two layers of protection films are formed such that a sheet resistance at a portion directly below the protection film is higher than that at a portion directly below the protection film. The protection films are formed, for example, of SiN film, as insulating films. The protection film is formed to be higher, for instance, in hydrogen concentration than the protection film so that the protection film is higher in refractive index of the protection film. The protection film is formed to cover a gate electrode and extend to the vicinity of the gate electrode on an electron supplying layer. The protection film is formed on the entire surface to cover the protection film. According to this configuration, the gate leakage is significantly reduced by a relatively simple configuration to realize a highly-reliable compound semiconductor device achieving high voltage operation, high withstand voltage, and high output.

6 Claims, 9 Drawing Sheets

(56) References Cited

U.S. PATENT DOCUMENTS

| | | |
|---|---|---|
| 7,256,432 B2 | 8/2007 | Okamoto et al. |
| 7,494,855 B2 | 2/2009 | Kikkawa |
| 7,638,818 B2 | 12/2009 | Wu et al. |
| 7,955,918 B2 | 6/2011 | Wu et al. |
| 7,989,278 B2 | 8/2011 | Kikkawa |
| 2004/0144991 A1 | 7/2004 | Kikkawa |
| 2006/0043415 A1* | 3/2006 | Okamoto et al. ............. 257/192 |
| 2006/0054925 A1 | 3/2006 | Kikkawa |
| 2006/0255366 A1 | 11/2006 | Sheppard et al. |
| 2007/0114569 A1 | 5/2007 | Wu et al. |
| 2007/0176204 A1* | 8/2007 | Murata et al. ................ 257/192 |
| 2009/0170249 A1 | 7/2009 | Kikkawa |
| 2010/0155779 A1* | 6/2010 | Murase et al. ................ 257/192 |
| 2011/0089430 A1 | 4/2011 | Kikkawa |
| 2011/0220966 A1 | 9/2011 | Wu et al. |

FOREIGN PATENT DOCUMENTS

| | | |
|---|---|---|
| JP | 2004-214471 A | 7/2004 |
| JP | 2004-221325 A | 8/2004 |
| JP | 2004-288952 A | 10/2004 |
| JP | 2005-159117 A | 6/2005 |
| JP | 2007-227884 A | 9/2007 |
| JP | 2009-026838 A | 2/2009 |
| JP | 2009-507396 A | 2/2009 |
| WO | 2007/040160 A1 | 4/2007 |
| WO | 2008/027027 A2 | 3/2008 |

OTHER PUBLICATIONS

Translation of the International Preliminary Report on Patentability (PCT/IB/338) (1 page), (PCT/IB/373) (1 page) of InternatApplication No. PCT/JP2009/057854 mailed Dec. 1, 2011, with (Form PCT/ISA/237) (5 pages).

Japanese Office Action dated Jul. 30, 2013, issued in corresponding Japanese Patent Application No. 2011-510105, w/ partial English translation.

* cited by examiner

COMPOUND SEMICONDUCTOR DEVICE AND METHOD OF MANUFACTURING THE SAME

CROSS-REFERENCE TO RELATED APPLICATION

This application is a divisional of U.S. application Ser. No. 13/276,830 filed Oct. 19, 2011, which is a Continuation of International Application No. PCT/JP2009/057854, with an international filing date of Apr. 20, 2009, which designating the United States of America, the entire contents of which are incorporated herein by reference.

FIELD

The present embodiments relates to a compound semiconductor device including an electron transit layer and an electron supply layer made of a nitride semiconductor, and a method of manufacturing the same.

BACKGROUND

Recently, an AlGaN/GaN.FET being a compound semiconductor device utilizing a hetero junction of the AlGaN/GaN and using GaN as the electron transit layer is actively developed (see, for example, Patent Documents 1 to 4). GaN is a material having a wide bandgap, a high breakdown field strength and a high saturation electron speed and is therefore very hopeful as a material of the semiconductor device achieving high-voltage operation and a high output. In the AlGaN/GaN.FET, the source electrode, the drain electrode, and the gate electrode are formed on the electron supply layer made of AlGaN and a protective film (for example, a SiN film) for reducing the surface trap is formed on the entire surface.

Patent Document 1: Japanese Laid-open Patent Publication No. 2007-227884
Patent Document 2: Japanese Laid-open Patent Publication No. 2004-288952
Patent Document 3: Japanese Laid-open Patent Publication No. 8-162476
Patent Document 4: Japanese Laid-open Patent Publication No. 4-282841

However, in the above-described AlGaN/GaN.FET, gate leakage larger than expected often occurs to make it difficult for the AlGaN/GaN.FET to perform high-voltage operation that is considered as an advantage thereof. Therefore, it is necessary to devise reduction of the gate leakage current in the AlGaN/GaN.FET, but any effective efficient measure has not been taken at present.

SUMMARY

An aspect of the compound semiconductor device includes: a substrate; an electron transit layer formed above the substrate; an electron supply layer formed above the electron transit layer; and a source electrode, a drain electrode, and a gate electrode formed between the source electrode and the drain electrode, which are formed above the electron supply layer, wherein a first region and a second region lower in two-dimensional electron gas concentration than the first region are formed between the gate electrode and the drain electrode between the electron transit layer and the electron supply layer, and wherein the first region is formed at a position biased to the drain electrode, and the second region is formed at a position biased to the gate electrode.

An aspect of the method of manufacturing a compound semiconductor device is a method of manufacturing a compound semiconductor device, the compound semiconductor device including: a substrate; an electron transit layer formed above the substrate; an electron supply layer formed above the electron transit layer; and a source electrode, a drain electrode, and a gate electrode formed between the source electrode and the drain electrode, which are formed above the electron supply layer, wherein a first insulating film is formed at a position closer to the drain electrode than to the gate electrode and a second insulating film is formed at a position closer to the gate electrode than to the drain electrode, between the gate electrode and the drain electrode, and wherein a two-dimensional electron gas concentration at a portion corresponding to below the second insulating film is made lower than a two-dimensional electron gas concentration at a portion corresponding to below the first insulating film between the electron transit layer and the electron supply layer.

Another aspect of the method of manufacturing a compound semiconductor device is a method of manufacturing a compound semiconductor device, the compound semiconductor device including: a substrate; an electron transit layer formed above the substrate; an electron supply layer formed above the electron transit layer; and a source electrode, a drain electrode, and a gate electrode formed between the source electrode and the drain electrode, which are formed above the electron supply layer, the method comprising: forming a depletion region altered in crystalline state in a surface layer of the electron supply layer; and forming the gate electrode such that the depletion region is located at a region more biased to the gate electrode than to the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

—Basic Gist of Embodiments—

In a compound semiconductor device, an increase of gate leakage current is caused by concentration of an electric field from a drain electrode to a gate electrode to an end point on the drain electrode side at the bottom of the gate electrode (hereinafter, referred to as a "drain side gate bottom end") during application of a high voltage. Hence, to decrease the gate leakage current, it is important to relax the electric field concentration at the drain side gate bottom end.

For relaxing the electric field concentration at the drain side gate bottom end, it is only necessary to disperse, in a sense, the electric field in a region between the drain electrode and the gate electrode (hereinafter, referred to as a "D-G region"), within the D-G region. In the embodiments, attention will be focused on a two-dimensional electron gas concentration at an interface between an electrode transit layer and an electron supply layer of the compound semiconductor device, namely, a sheet carrier concentration. The two-dimensional electron gas concentration at the interface below the D-G region is adjusted to be lower at a portion below the vicinity of the drain side gate bottom end than at the other portion. This makes the sheet resistance in the vicinity higher than that of the other portion, whereby the electric field in the D-G region is dispersed within the D-G region.

For the purpose of reducing the surface trap in order to adjust the two-dimensional electron gas concentration in the D-G region as described above, a protective film formed to cover the source electrode, the drain electrode, and the gate electrode is utilized. Concretely, two kinds of insulating films are formed in the D-G region with the film forming condition changed, for example, with the hydrogen concentration in the source gas or the input power changed. Alternatively, electron beam irradiation or ion implantation or the like may be performed on a portion corresponding to the vicinity of the drain side gate bottom end in the D-G region to alter the crystalline state of the vicinity.

By adjusting the two-dimensional electron gas concentration in the D-G region, the electric field concentration at the drain side gate bottom end is significantly relaxed to reduce the gate leakage, resulting in high-voltage operation, high withstand voltage, and high output of the compound semiconductor device.

—Concrete Embodiments—

Hereinafter, concrete embodiments will be described in detail with reference to the drawings based on the above-described basic gist.

First Embodiment

In this embodiment, the configuration of an AlGaN/GaN-.FET being a compound semiconductor device will be described together with a method of manufacturing the same.

FIG. 1A to FIG. 1F are schematic sectional views illustrating the method of manufacturing the compound semiconductor device according to the first embodiment in the order of steps.

Figure 1A:
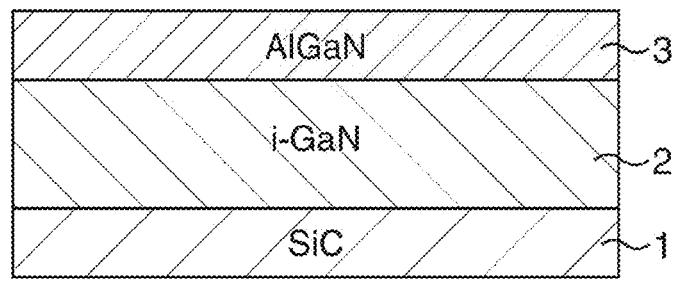
FIG. 1A is a schematic sectional view illustrating the method of manufacturing a compound semiconductor device according to a first embodiment in the order of steps.

First, an electron transit layer 2 and an electron supply layer 3 are formed as illustrated in FIG. 1A.

More specifically, intentionally undoped GaN (i-GaN) and intentionally undoped AlGaN (i-AlGaN) are sequentially deposited on a substrate, a SiC substrate 1 here, for example, by the MOVPE method to form the electron transit layer 2 and the electron supply layer 3. Here, the electron transit layer 2 is formed to have a film thickness of about 3 μm and the electron supply layer 3 is formed as $Al_{0.25}Ga_{0.75}N$ to have a film thickness of 20 nm.

Figure 1B:
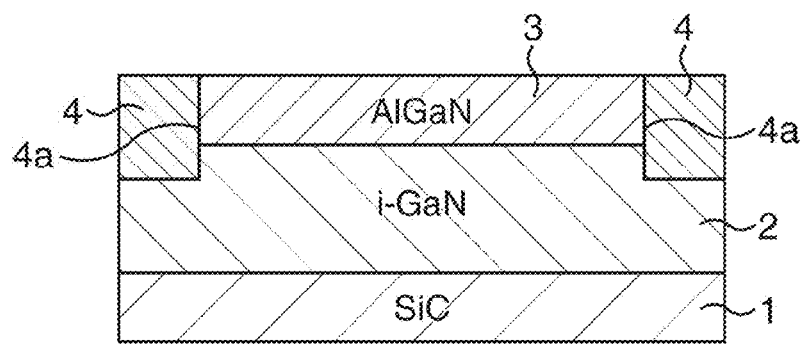
FIG. 1B is a schematic sectional view, subsequent to FIG. 1A, illustrating the method of manufacturing the compound semiconductor device according to the first embodiment in the order of steps.

Subsequently, element isolation structures 4 are formed by the STI (Shallow Trench Isolation) method as illustrated in FIG. 1B.

More specifically, first, isolation trenches 4a with a depth deep in a part of the electron transit layer 2 under the electron supply layer 3 are formed at element isolation regions on the electron supply layer 3.

Subsequently, an insulator, a silicon oxide here, is deposited on the electron supply layer 3 by the CVD method or the like so as to fill the insides of the isolation trenches 4a. Then, the silicon oxide on the electron supply layer 3 is polished to be removed, for example, by the CMP (Chemical-Mechanical Polishing) method. In this event, the element isolation structures 4 filling the insides of the isolation trenches 4a are formed. The formation of the element isolation structures 4 makes the region remaining on the electron supply layer 3 an active region.

Here, instead of forming the isolation trenches 4a and filling the insulator in the isolation trenches 4a, a method of ion-implanting impurities into the element isolation regions on the electron supply layer 3 to make the element isolation regions into an insulated condition.

Figure 1C:
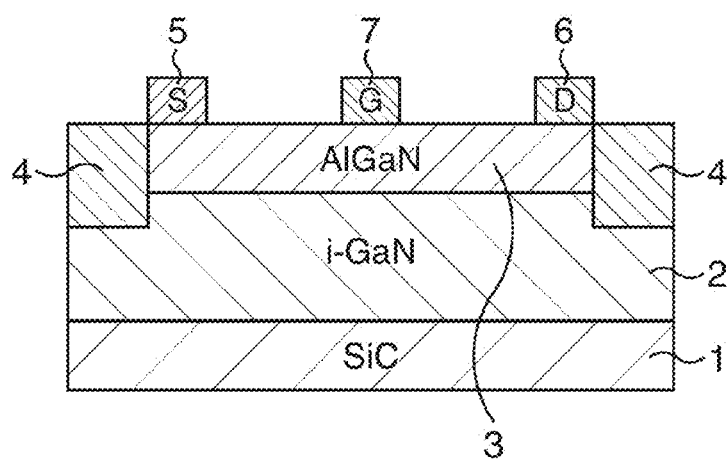
FIG. 1C is a schematic sectional view, subsequent to FIG. 1B, illustrating the method of manufacturing the compound semiconductor device according to the first embodiment in the order of steps.

Subsequently, a source electrode 5, a drain electrode 6, and a gate electrode 7 are formed as illustrated in FIG. 1C.

More specifically, first, resist is applied to the entire surface, and a resist pattern (not illustrated) having openings at formation planned regions for forming the source electrode 5 and the drain electrode 6 in the active region, is formed by the lithography. Then, an electrode material, for example, Ti/Al is layered on the resist pattern so as to fill the openings, for example, by the vapor deposition method. Thereafter, a warmed organic solvent or the like is used to remove the resist pattern together with Ti/Al thereon. Thereafter, annealing treatment is performed on the SiC substrate 1 at a temperature of, for example, about 550° C. Thus, the source electrode 5 and the drain electrode 6 which are a pair of ohmic electrodes made of Ti/Al are formed.

Next, resist is applied to the entire surface, and a resist pattern (not illustrated) having an opening at a formation planned region for forming the gate electrode 7 is formed by the lithography. Then, an electrode material, for example Ni/Au is layered on the resist pattern so as to fill the opening, for example, by the vapor deposition method. Thereafter, a warmed organic solvent or the like is used to remove the resist pattern together with Ni/Au thereon. Thus, the gate electrode 7 made of Ni/Au is formed.

Figure 1D:
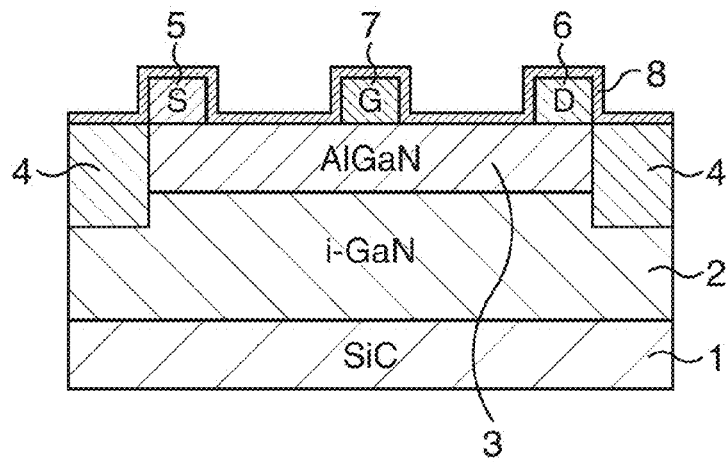
FIG. 1D is a schematic sectional view, subsequent to FIG. 1C, illustrating the method of manufacturing the compound semiconductor device according to the first embodiment in the order of steps.
Figure 1E:
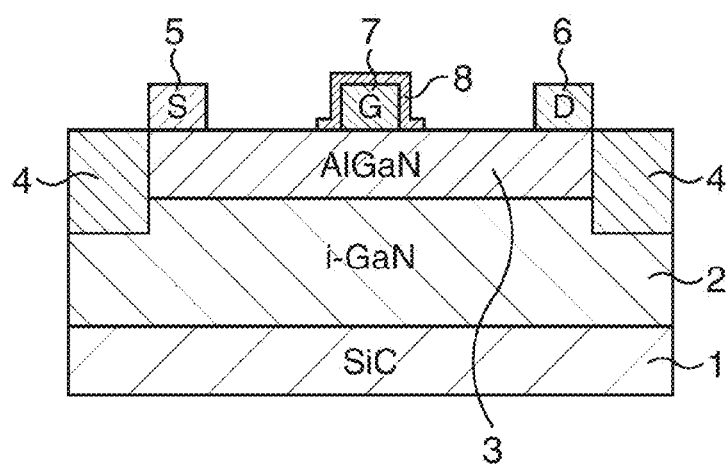
FIG. 1E is a schematic sectional view, subsequent to FIG. 1D, illustrating the method of manufacturing the compound semiconductor device according to the first embodiment in the order of steps.
Figure 1F:
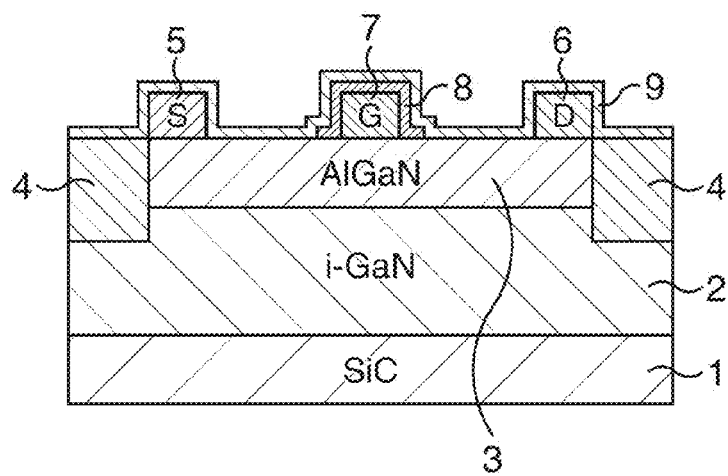
FIG. 1F is a schematic sectional view, subsequent to FIG. 1E, illustrating the method of manufacturing the compound semiconductor device according to the first embodiment in the order of steps.

Subsequently, two layers of protective films 8, 9 are formed such that the sheet resistance is higher at a portion directly below the protective film 8 than at a portion directly below the protective film 9 as illustrated in FIG. 1D to FIG. 1F. The protective films 8, 9 are formed, for example, of SiN film, as insulating films. The protective film 8 is formed to be higher, for example, in hydrogen concentration higher than the protective film 9 so that the protective film 8 is higher than in refractive index than the protective film 9. The protective film 8 is formed to cover the gate electrode 7 and extend to the vicinity of the gate electrode 7 on the electron supply layer 3. The protective film 9 is formed on the entire surface to cover the protective film 8.

Hereinafter, the steps in FIG. 1D to FIG. 1F will be described in detail.

First, the protective film 8 is formed to cover the gate electrode 7 as illustrated FIG. 1D.

More specifically, the plasma CVD method is used for instance. The film forming condition is that the plasma excitation frequency is 13.56 MHz, the high-frequency output being the input power is 50 W, the source gas is a mixed gas of $SiH_4$, $N_2$, and He, and the gas flow rate is $SiH_4/N_2/He=3$ sccm/150 sccm/1000 sccm. Under this condition, SiN with a film thickness of about 50 nm is deposited on the entire surface to form the protective film 8.

Subsequently, the protective film 8 is processed as illustrated FIG. 1E.

More specifically, the protective film 8 is processed by the photolithography and dry etching, for example, using a fluorinated gas such that the protective film 8 is left to cover the gate electrode 7 and extend to the vicinity of the gate electrode 7 on the electron supply layer 3. The distance between the drain electrode 6 and the gate electrode 7 (a D-G distance) is, for example, about (1 μm) to about (20 μm), and the length of the protective film 8 on the electron supply layer 3 (the length of the protective film 8 extending on the electron supply layer 3) is, for example, about (0.1 μm) to about (2 μm).

Subsequently, the protective film 9 is formed on the entire surface to cover the protective film 8 as illustrated in FIG. 1F.

More specifically, the plasma CVD method is used for instance. The film forming condition is that the plasma excitation frequency is 13.56 MHz, the high-frequency output being the input power is 50 W, the source gas is a mixed gas of $SiH_4$, $N_2$, and He, and the gas flow rate is $SiH_4/N_2/He=2$ sccm/150 sccm/1000 sccm. Here, the flow rate of $SiH_4$ is adjusted to be lower than that in forming the protective film 8. Under this condition, SiN with a film thickness of about 50 nm is deposited on the entire surface to form the protective film 9.

By adjusting the flow rate of $SiH_4$ as described above, the hydrogen concentrations of the protective films 8, 9 become the hydrogen concentration of the protective film 8>the hydrogen concentration of the protective film 9.

The hydrogen concentrations of the protective films 8, 9 are adjusted by appropriately selecting the flow rate of $SiH_4$ in forming them so that the flow rate for the protective film 8 is higher than that for the protective film 9, for example, in a range of about 2.0 sccm to about 3 sccm.

In forming the protective films 8, 9, the qualities may be adjusted so that the protective film 8 is appropriately altered more than the protective film 9 instead of adjusting the hydrogen concentrations as described above. Concretely, in the film forming condition in forming the protective films 8, 9 by the plasma CVD method, the input power for the protective film 8 is made higher than that for the protective film 9.

The degrees of quality alteration of the protective films 8, 9 are adjusted by appropriately selecting the high-frequency output being the input power in forming them so that the high-frequency output for the protective film 8 is higher than that for the protective film 9 in a range, for example, of about 50 W to about 200 W.

The protective films 8, 9 are formed with the flow rate of $SiH_4$ in the source gas and the input power appropriately adjusted. Examples of selection of the film forming condition are listed in the following Table 1. Table 1 illustrates the sheet resistance when the sheet resistance between G-D before deposition of the protective films is 1. Here, SiN(C) is defined as standard.

TABLE 1

|  |  | Before deposition of SiN | After deposition of SiN |
|---|---|---|---|
|  | SiN(A) | 1 | 0.81 |
|  | SiN(B) | 1 | 0.9 |
| Standard → | SiN(C) | 1 | 0.99 |
|  | SiN(D) | 1 | 1.23 |

SiN(A) is a protective film formed under the film forming condition of the plasma CVD method set such that the plasma excitation frequency is 13.56 MHz, the high-frequency output being the input power is 50 W, the source gas is a mixed gas of $SiH_4$, $N_2$, and He, and the gas flow rate is $SiH_4/N_2/$He=2.0 sccm/150 sccm/1000 sccm.

SiN(B) is a protective film formed under the film forming condition of the plasma CVD method set such that the plasma excitation frequency is 13.56 MHz, the high-frequency output being the input power is 50 W, the source gas is a mixed gas of $SiH_4$, $N_2$, and He, and the gas flow rate is $SiH_4/N_2/$He=2.9 sccm/150 sccm/1000 sccm.

SiN(C) is a protective film formed under the film forming condition of the plasma CVD method set such that the plasma excitation frequency is 13.56 MHz, the high-frequency output being the input power is 100 W, the source gas is a mixed gas of $SiH_4$, $N_2$, and He, and the gas flow rate is $SiH_4/N_2/$He=2.9 sccm/150 sccm/1000 sccm.

SiN(D) is a protective film formed under the film forming condition of the plasma CVD method set such that the plasma excitation frequency is 13.56 MHz, the high-frequency output being the input power is 200 W, the source gas is a mixed gas of $SiH_4$, $N_2$, and He, and the gas flow rate is $SiH_4/N_2/$He=3.0 sccm/150 sccm/1000 sccm.

For example, it is only necessary to form the protective films 8, 9 by appropriately selecting two film forming conditions from among the film forming conditions of SiNs (A) to (D) so that the protective film 8 is higher in sheet resistance than the protective film 9.

The AlGaN/GaN.FET is formed in the above manner.

Hereinafter, the function of the compound semiconductor device according to this embodiment will be described based on the comparison with a comparative example having a single layer of protective film.

Figure 2A:
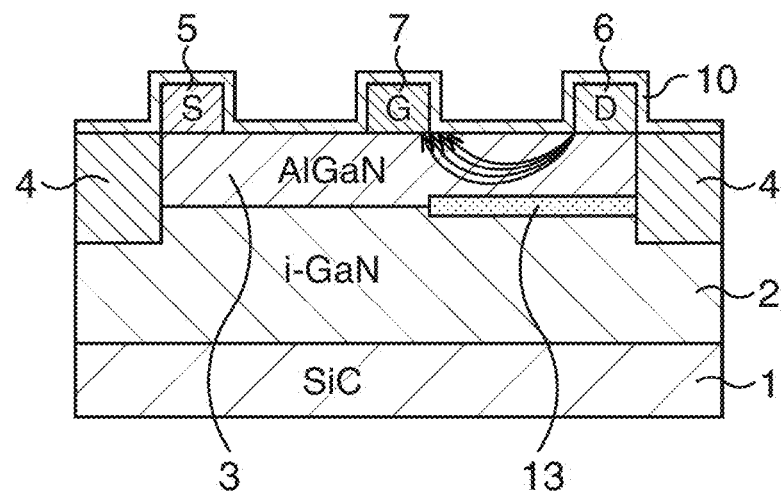
FIG. 2A is a schematic sectional view illustrating the function of a comparative example of the compound semiconductor device according to the first embodiment.
Figure 2B:
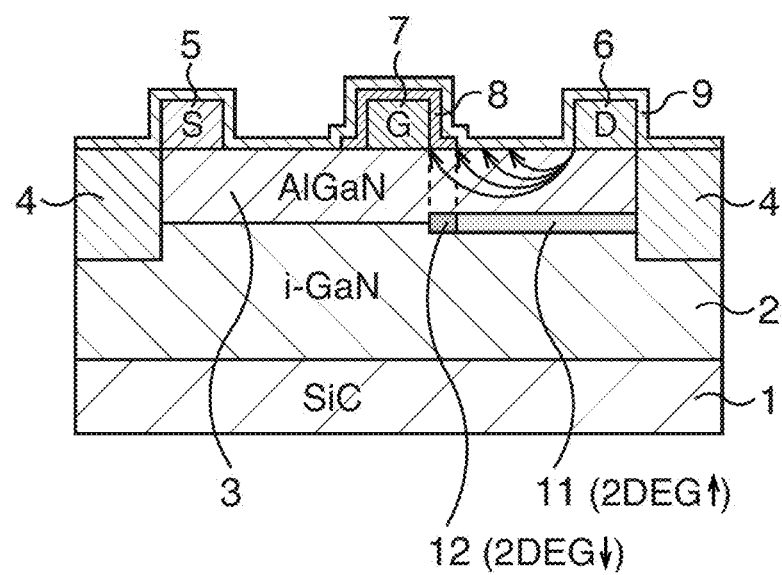
FIG. 2B is a schematic sectional view illustrating the function of the compound semiconductor device according to the first embodiment.

FIG. 2A and FIG. 2B are schematic sectional views illustrating the functions of the compound semiconductor devices, FIG. 2A illustrating the comparative example and FIG. 2B illustrating this embodiment. In the comparative example of FIG. 2A, after undergoing the steps of FIG. 1A to FIG. 1E, a protective film 10 is formed to have a film thickness of about 100 nm, for example, under the standard condition in Table 1 (the condition of forming the SiN(C)).

In the compound semiconductor device, there is a two-dimensional electron gas at the interface between the electron transit layer 2 and the electro supply layer 3. Attention will be focused on an interface region between D-G of the interface.

In the comparative example of FIG. 2A, the two-dimensional electron gas concentration (sheet carrier concentration) is substantially constant in an interface region 13 between D-G. Accordingly, the sheet resistance directly below the protective film (at a portion where the electron supply layer 3 is in contact with the protect film 10) is substantially constant. With this configuration, the electric field generated between D-G directing from the drain electrode 6 to the gate electrode 7 concentrates on the vicinity of a bottom end on the drain electrode 6 side of the gate electrode 7 as illustrated by arrows in FIG. 2A. Due to this electric field concentration, the gate leakage current increases.

In contrast, in this embodiment of FIG. 2B, the two-dimensional electron gas concentration in a second interface region 12 that is a portion corresponding to below the protective film 8 is lower than the two-dimensional electron gas concentration in a first interface region 11 that is a portion corresponding to below the protective film 9, between D-G. Accordingly, a sheet resistance R2 directly below the protective film 8 (at a portion where the electron supply layer 3 is in contact with the protective film 8) is higher than a sheet resistance R1 directly below the protective film 9 (at a portion where the electron supply layer 3 is in contact with the protective film 9).

R2>R1

It is considered that the change in sheet resistance occurs because Si is incorporated into a lower portion of the SiN film during deposition of the SiN film in the deposition of the protective film 9 to change the potential on the surface of the electron supply layer 3. With the configuration of FIG. 2B, the electric field generated between D-G directing from the drain electrode 6 to the gate electrode 7 is dispersed, in a sense, within the D-G region as illustrated by arrows in FIG. 2B.

In this embodiment, the electric field concentration at the bottom end on the drain electrode 6 side of the gate electrode 7 is relaxed to significantly reduce the gate leakage current, resulting in improved gate withstand voltage.

As described above, according to this embodiment, the gate leakage is significantly reduced by a relatively simple configuration to realize a highly-reliable AlGaN/GaN.FET achieving high-voltage operation, high withstand voltage, and high output.

MODIFIED EXAMPLES

Here, various modified examples of the first embodiment will be described.

Figure 3A:
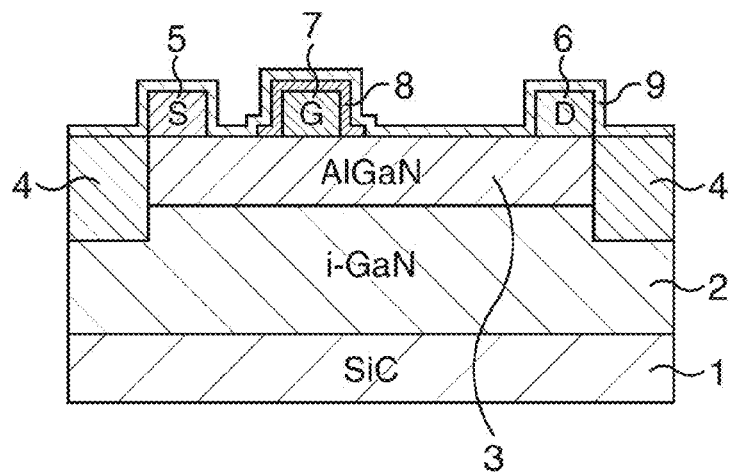
FIG. 3A is a schematic sectional view illustrating a modified example 1 of the first embodiment.
Figure 3B:
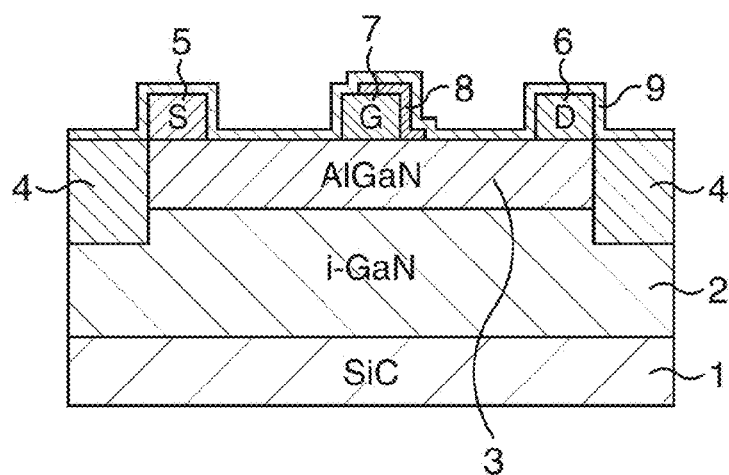
FIG. 3B is a schematic sectional view illustrating a modified example 2 of the first embodiment.
Figure 3C:
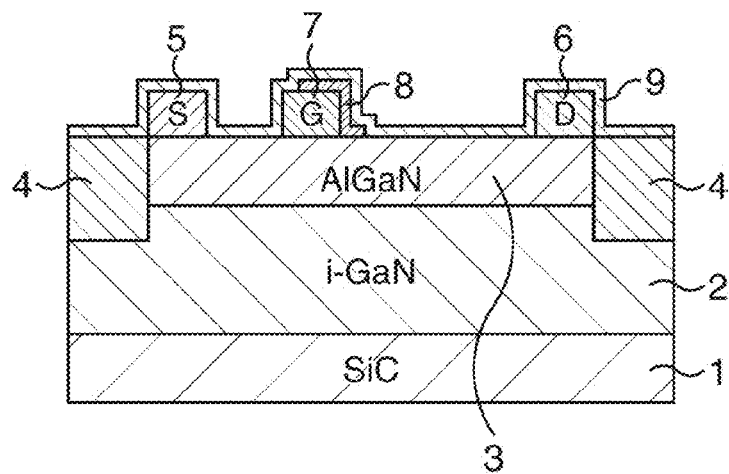
FIG. 3C is a schematic sectional view illustrating a modified example 3 of the first embodiment.

FIG. 3A to FIG. 3C are sectional views illustrating only the appearance of AlGaN/GaN.FETs corresponding to FIG. 1F of the first embodiment in the various modified examples of the first embodiment. FIG. 3A, FIG. 3B, and FIG. 3C correspond to a modified example 1, a modified example 2, and a modified example 3, respectively.

(1) Modified Example 1

In this example, the gate electrode 7 is formed to be biased to the source electrode 5 side in a region between the source electrode 5 and the drain electrode 6 (between S-G) on the electron supply layer 3 as illustrated in FIG. 3A. In other words, the gate electrode 7 is formed at a position that the distance between S-G is shorter than the distance between D-G.

To form the gate electrode 7 at the biased position as described above, it is only necessary to form the gate electrode 7 at a desired biased position after the source electrode 5 and the drain electrode 6 are formed in the step of FIG. 1C in the first embodiment.

According to this example, because the distance between D-G is made longer, the electric field concentration at the bottom end on the drain electrode 6 side of the gate electrode 7 is further relaxed, whereby the occurrence of the gate leakage can be suppressed more surely, in addition to the above-described various effects in the first embodiment.

(2) Modified Example 2

In this example, the protective film 8 under the protective film 9 is formed to cover the gate electrode 7 from a predetermined point of the upper surface of the gate electrode 7 toward the drain electrode 6 side and extend to the vicinity of the gate electrode 7 on the electron supply layer 3 as illustrated in FIG. 3B. The protective film 8 does not exist in the vicinity of the gate electrode 7 on the source electrode 5 side on the electron supply layer 3.

To relax the electric field concentration between the drain electrode 6 and the gate electrode 7, it is sufficient that the protective film 8 exists in the vicinity of the gate electrode 7 on the drain electrode 6 side on the electron supply layer 3, and the protective film 8 is not particularly required in the vicinity of the gate electrode 7 on the source electrode 5 side on the electron supply layer 3.

To form the protective film 8 as in this example, the protective film 8 formed on the entire surface to cove the gate electrode 7 is processed by the photolithography and dry etching using, for example, a fluorinated gas as described below in the step of FIG. 1E in the first embodiment. That is, the protective film 8 is left to cover the gate electrode 7 from the predetermined point of the upper surface of the gate electrode 7 toward the drain electrode 6 side and extend to the vicinity of the gate electrode 7 on the electron supply layer 3.

According to this example, the protective film 8 is left only in a necessary place as small as possible, whereby the configuration is simplified, in addition to the above-described various effects in the first embodiment.

(3) Modified Example 3

In this example, an AlGaN/GaN.FET employing both the modified examples 1, 2 is disclosed as illustrated in FIG. 3C. Specifically, the gate electrode 7 is formed to be more biased to the source electrode 5 side than to the drain electrode 6 side, and the protective film 8 is formed to cover the gate electrode 7 from a predetermined point of the upper surface of the gate electrode 7 toward the drain electrode 6 side and extend to the vicinity of the gate electrode 7 on the electron supply layer 3.

According to this example, the effects specific to the above-described modified examples 1, 2 can be achieved in addition to the above-described effects in the first embodiment.

Second Embodiment

In this embodiment, the configuration of an AlGaN/GaN-.FET being a compound semiconductor device will be described together with a method of manufacturing the same. This embodiment is different from the first embodiment in that the forming process of the protective film 8 is different.

FIG. 4A to FIG. 4G are schematic sectional views illustrating the method of manufacturing the compound semiconductor device according to the second embodiment in the order of main steps.

First, the compound semiconductor device undergoes, as in the first embodiment, the steps similar to those in FIG. 1A and FIG. 1B.

Figure 4A:
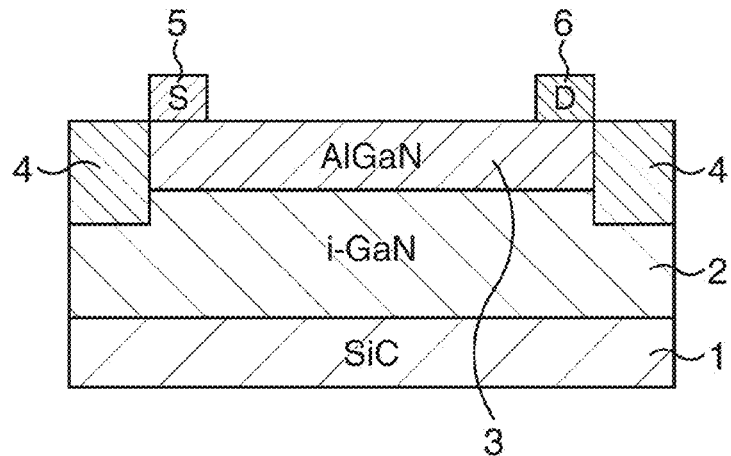
FIG. 4A is a schematic sectional view illustrating the method of manufacturing a compound semiconductor device according to a second embodiment in the order of steps.
Figure 4B:
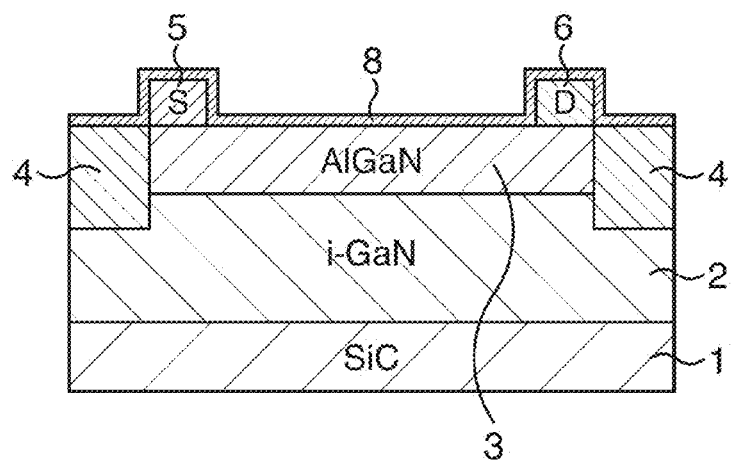
FIG. 4B is a schematic sectional view, subsequent to FIG. 4A, illustrating the method of manufacturing the compound semiconductor device according to the second embodiment in the order of steps.

Subsequently, a source electrode 5 and a drain electrode 6 are formed as in FIG. 1C as illustrated in FIG. 4A, and a protective film 8 is formed on the entire surface under the same condition as that of the protective film 8 formed in FIG. 1D as illustrated in FIG. 4B.

Figure 4C:
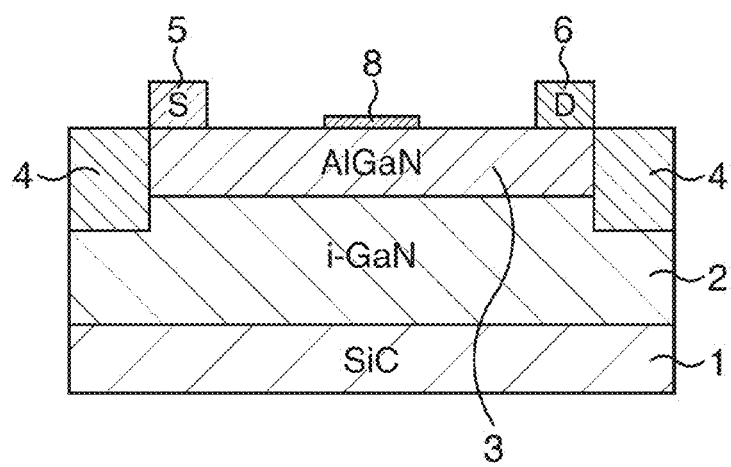
FIG. 4C is a schematic sectional view, subsequent to FIG. 4B, illustrating the method of manufacturing the compound semiconductor device according to the second embodiment in the order of steps.

Subsequently, the protective film 8 is processed as illustrated in FIG. 4C.

More specifically, the protective film 8 is processed by the photolithography and dry etching, for example, using a fluorinated gas are used such that the protective film 8 is left at a formation planned region for forming the gate electrode to slightly bulge out at least to the drain electrode 6 side from the region. Here, the protective film 8 may be left in a shape bulging out only to the drain electrode 6 side.

Figure 4D:
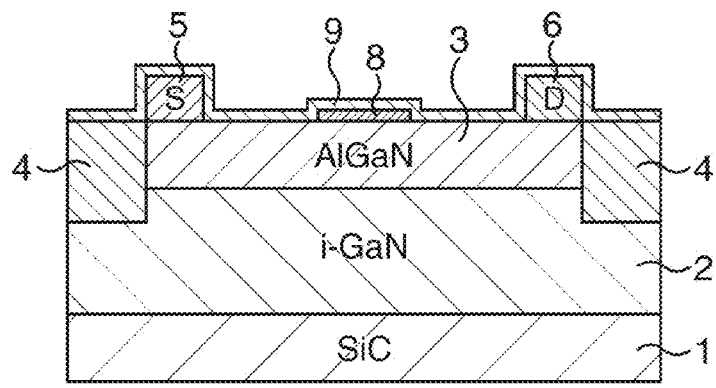
FIG. 4D is a schematic sectional view, subsequent to FIG. 4C, illustrating the method of manufacturing the compound semiconductor device according to the second embodiment in the order of steps.

Subsequently, the protective film 9 is formed on the entire surface to cover the protective film 8 under the film forming condition as that of the protective film 9 formed in FIG. 1F as illustrated in FIG. 4D.

Figure 4E:
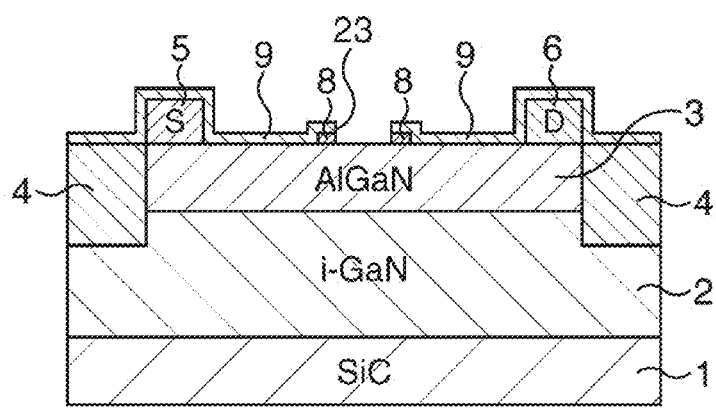
FIG. 4E is a schematic sectional view, subsequent to FIG. 4D, illustrating the method of manufacturing the compound semiconductor device according to the second embodiment in the order of steps.

Subsequently, an opening 23 is formed in the protective films 8, 9 as illustrated in FIG. 4E.

More specifically, the photolithography and dry etching, for example, using a fluorinated gas are used to process the protective film 9 and the protective film 8 to form the opening 23 exposing the formation planned region for forming the gate electrode on the surface of the electron supply layer 3. By the dry etching of forming the opening 23, the protective film 8 is exposed, at its one end face, from the inner wall of the opening 23 and left on the electron supply layer 3 to slightly extend at least to the drain electrode 6 side. When the protective film 8 is left in the shape of bulging out only to the drain electrode 6 side in the step of FIG. 4C, the protective film 8 will be left only on the drain electrode 6 side in the step of FIG. 4E.

Figure 4F:
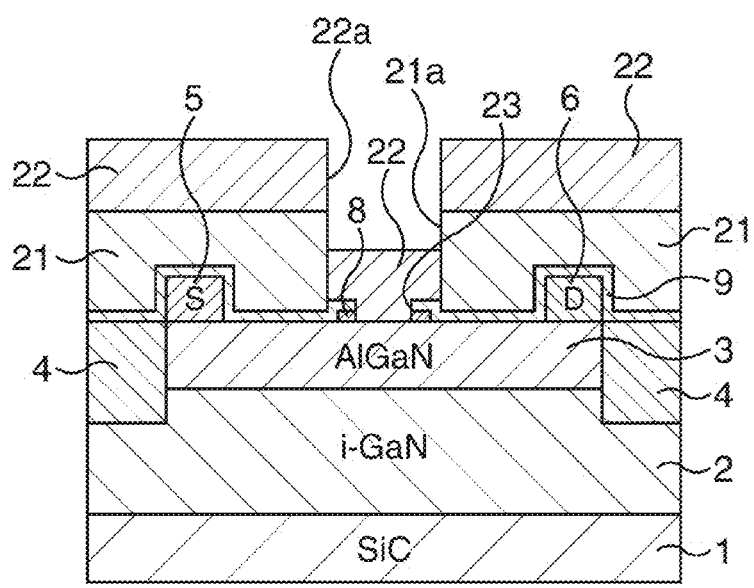
FIG. 4F is a schematic sectional view, subsequent to FIG. 4E, illustrating the method of manufacturing the compound semiconductor device according to the second embodiment in the order of steps.

Subsequently, a resist pattern 21 is formed, and a gate material 22 is then deposited as illustrated in FIG. 4F. The resist pattern 21 may be formed of a two-layer resist.

More specifically, resist is first applied to the entire surface to fill the opening 23 and the photolithography is used to expose the resist to thereby process the resist. Concretely, at a portion of the resist corresponding to the formation planned region for forming the gate electrode, an opening 21a having a size slightly larger at least on the drain electrode 6 side than that of the region is formed to form the resist pattern 21.

Then, the gate material 22, for example, Ni/Au is layered on the resist pattern 21 so as to fill the openings 21a, 23, for example, by the vapor deposition method.

Figure 4G:
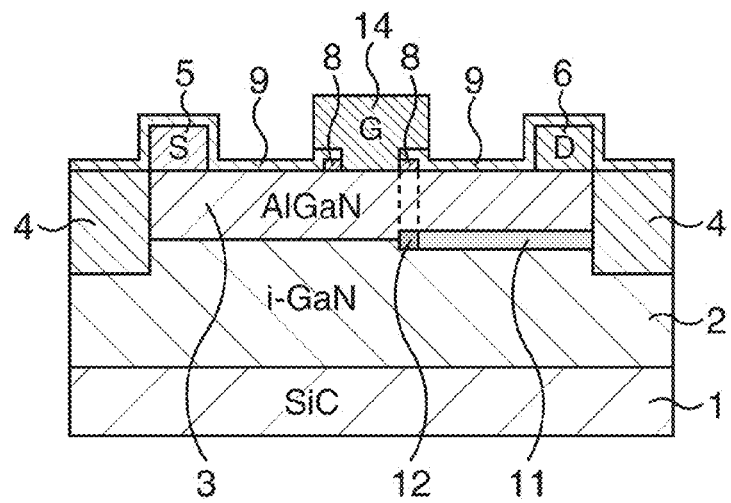
FIG. 4G is a schematic sectional view, subsequent to FIG. 4F, illustrating the method of manufacturing the compound semiconductor device according to the second embodiment in the order of steps.

Subsequently, a gate electrode 14 is formed as illustrated in FIG. 4G.

More specifically, a warmed organic solvent or the like is used to remove the resist pattern 21 together with the gate material 22 thereon. Thus, the gate electrode 14 made of Ni/Au having a bottom end in contact with one end face of the protective film 8 on the electron supply layer 3 and formed in a so-called overhang shape that the upper portion thereof rides on, at its end, the protective film 9 is formed.

In the AlGaN/GaN.FET according to this embodiment, the two-dimensional electron gas concentration in a second interface region 12 that is a portion corresponding to below the protective film 8 is lower than the two-dimensional electron gas concentration in a first interface region 11 that is a portion corresponding to below the protective film 9, between D-G as in the first embodiment. Accordingly, the sheet resistance directly below the protective film 8 (at a portion where the electron supply layer 3 is in contact with the protective film 8) is higher than the sheet resistance directly below the protective film 9 (at a portion where the electron supply layer 3 is in contact with the protective film 9).

In this embodiment, the electric field concentration at the bottom end on the drain electrode 6 side of the gate electrode 14 is relaxed to significantly reduce the gate leakage current, resulting in improved gate withstand voltage.

Further, in this embodiment, the gate electrode 14 is formed in the shape that the upper portion thereof rides on, at its end, the protective film 9. Since the bottom ends exist at two points, in a sense, on the drain electrode 6 side of the gate electrode 14, the electric field generated between D-G from the drain electrode 6 toward the gate electrode 7 is dispersed in a sense to the bottom ends at the two points. Accordingly, the electric field concentration at the bottom end on the drain electrode 6 side of the gate electrode 14 will be further relaxed due to the shape of the gate electrode 14.

Note that the gate electrode 14 may be formed to be more biased to the source electrode 5 side than to the drain electrode 6 side as in the modified example 1 of the first embodiment also in this embodiment.

As described above, according to this embodiment, the gate leakage is significantly reduced by a relatively simple configuration to realize a highly-reliable AlGaN/GaN.FET achieving high-voltage operation, high withstand voltage, and high output.

Third Embodiment

In this embodiment, the configuration of an AlGaN/GaN-.FET being a compound semiconductor device will be described together with a method of manufacturing the same. This embodiment is different from the first embodiment in that a depletion region is formed, in place of the protective film 8, in the electro supply layer 3.

Figure 5A:
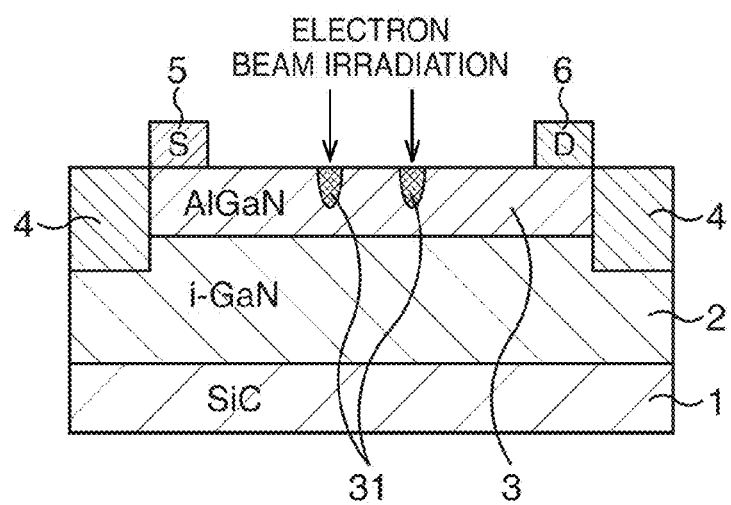
FIG. 5A is a schematic sectional view illustrating the method of manufacturing a compound semiconductor device according to a third embodiment in the order of steps.
Figure 5B:
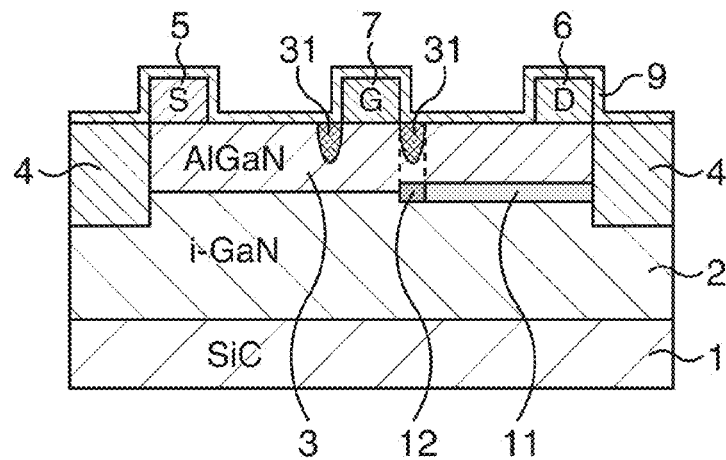
FIG. 5B is a schematic sectional view, subsequent to FIG. 5A, illustrating the method of manufacturing the compound semiconductor device according to the third embodiment in the order of steps.

FIG. 5A and FIG. 5B are schematic sectional views illustrating the method of manufacturing the compound semiconductor device according to the third embodiment in the order of main steps.

First, the compound semiconductor device undergoes, as in the first embodiment, the steps similar to those of FIG. 1A and FIG. 1B.

Subsequently, a source electrode 5 and a drain electrode 6 are formed as in FIG. 1C, and both sides of a formation planned region for forming the gate electrode of the electro supply layer 3 are then irradiated with electron beams as illustrated in FIG. 5A. Here, only the drain electrode 6 side of the formation planned region for forming the gate electrode may be irradiated with electron beams. The electron beam irradiation condition is set to, for example, 20 keV, 1000 μC/cm². The electron beam irradiation damages the surface layer of the electron supply layer 3 on both sides of the formation planned region for forming the gate electrode to alter the crystal structure of AlGaN, resulting in formation of depletion regions 31.

Note that instead of irradiation of the electron beams, a predetermined element, for example, Ar may be ion-implanted to both sides or only on the drain electrode 6 side of the formation planned region for forming the gate electrode of the electron supply layer 3 to form the depletion region.

Thereafter, a gate electrode 7 is formed to come into contact (or adjacent), at the bottom ends, with the depletion regions 31 under the same condition as that in FIG. 1C of the first embodiment, and a protective film 9 is formed (the protective film 8 is not formed) as in FIG. 1F as illustrated in FIG. 5B to form an AlGaN/GaN.FET.

In the AlGaN/GaN.FET according to this embodiment, the two-dimensional electron gas concentration in a second interface region 12 that is a portion corresponding to below the depletion region 31 is lower than the two-dimensional electron gas concentration in a first interface region 11 that is a portion corresponding to below the protective film 9 where the depletion region 31 is not formed, between D-G. Accordingly, the sheet resistance in the depletion region 31 is higher than the sheet resistance directly below the protective film 9 (at a portion where the electron supply layer 3 is in contact with the protective film 9).

In this embodiment, the electric field concentration at the bottom end on the drain electrode 6 side of the gate electrode 7 is relaxed to significantly reduce the gate leakage current, resulting in improved gate withstand voltage.

As described above, according to this embodiment, the gate leakage is significantly reduced by a relatively simple configuration to realize a highly-reliable AlGaN/GaN.FET achieving high-voltage operation, high withstand voltage, and high output.

Fourth Embodiment

In this embodiment, the configuration of an n-Gan.FET having an n-type GaN (n-Gan) layer on an electron supply layer will be described together with a method of manufacturing the same.

FIG. 6A to FIG. 6D are schematic sectional views illustrating the method of manufacturing a compound semiconductor device according to the fourth embodiment in the order of main steps.

Figure 6A:
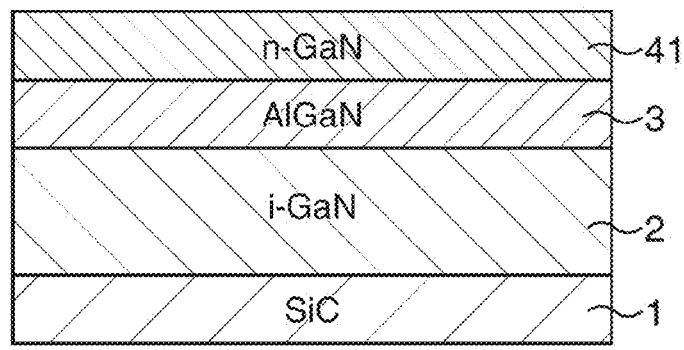
FIG. 6A is a schematic sectional view illustrating the method of manufacturing a compound semiconductor device according to a fourth embodiment in the order of steps.

First, an electron transit layer 2 and an electron supply layer 3 are formed on a SiC substrate 1 under the same condition as that in FIG. 1A of the first embodiment, and a cap layer 41 is then formed as illustrated in FIG. 6A.

More specifically, an n-Gan (for example, Si is doped therein and the doping concentration is, for example, about $2 \times 10^{18}/cm^3$) is deposited, for example, by the MOVPE method to have a film thickness of 10 nm or less, for example, about 5 nm to form the cap layer 41. Formation of the cap layer 41 can further reduce the surface trap.

Figure 6B:
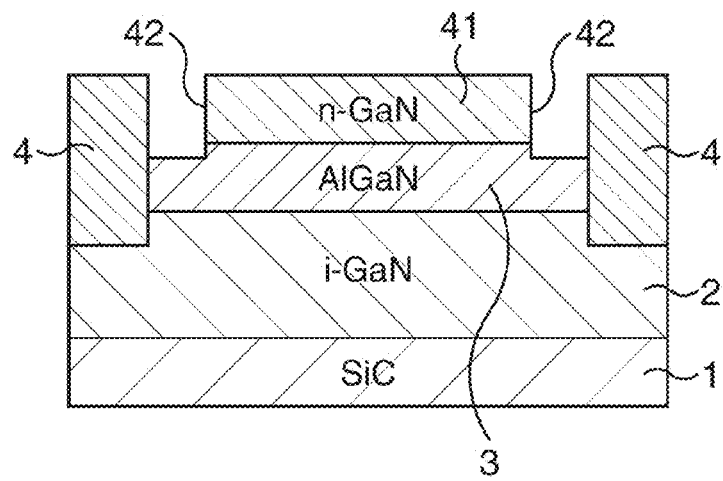
FIG. 6B is a schematic sectional view, subsequent to FIG. 6A, illustrating the method of manufacturing the compound semiconductor device according to the fourth embodiment in the order of steps.

Subsequently, openings 42 are formed at formation planned regions for forming a source electrode and a drain electrode as illustrated in FIG. 6B.

More specifically, the openings 42 with a depth deep in a part of the electron supply layer 3 under the cap layer 41 are formed at the formation planned regions for forming the source electrode and the drain electrode on the cap layer 41 by the photolithography and dry etching, for example, using a fluorinated gas.

Figure 6C:
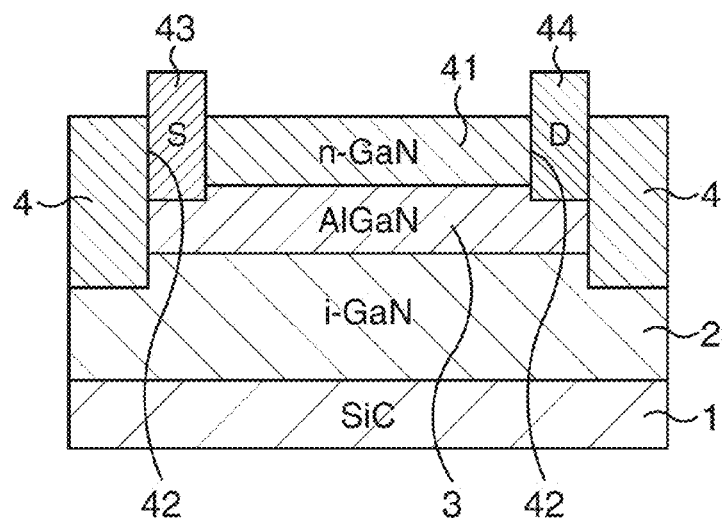
FIG. 6C is a schematic sectional view, subsequent to FIG. 6B, illustrating the method of manufacturing the compound semiconductor device according to the fourth embodiment in the order of steps.

Subsequently, a source electrode 43 and a drain electrode 44 are formed as illustrated in FIG. 6C.

More specifically, resist is applied to the entire surface and a resist pattern (not illustrated) having openings to expose the openings 42 which are the formation planned regions for forming the source electrode 43 and the drain electrode 44 in the active region is formed by the photolithography. Then, an electrode material, for example, Ti/Al is layered on the resist pattern to fill the openings, for example, by the vapor deposition method. Thereafter, a warmed organic solvent or the like is used to remove the resist pattern together with Ti/Al thereon. Thereafter, annealing treatment is performed on the SiC substrate 1 at a temperature of, for example, about 550° C. Thus, the source electrode 43 and the drain electrode 44 which are a pair of ohmic electrodes filling the openings 42 with Ti/Al and having upper portions projecting from the surface of the cap layer 41 are formed.

Figure 6D:
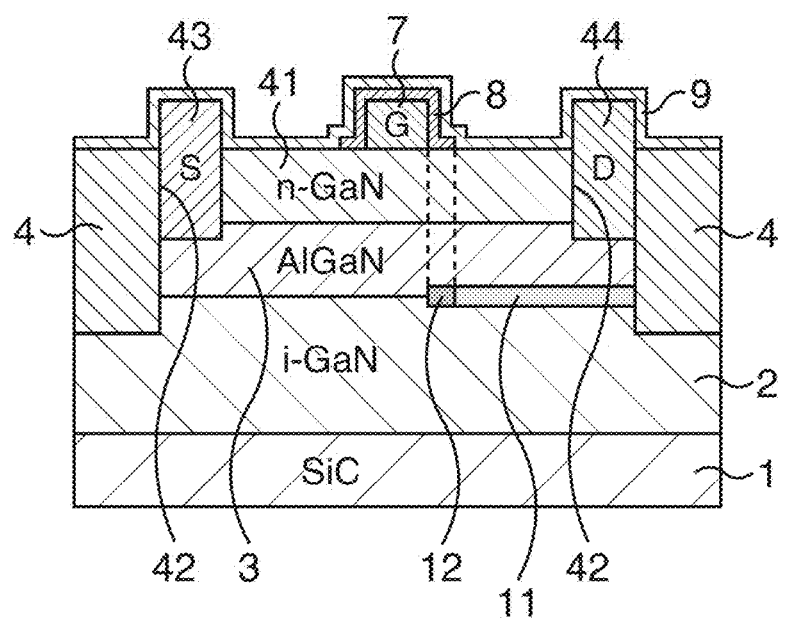
FIG. 6D is a schematic sectional view, subsequent to FIG. 6C, illustrating the method of manufacturing the compound semiconductor device according to the fourth embodiment in the order of steps.

Thereafter, a gate electrode 7 is formed on the cap layer 41 under the same condition as that in FIG. 1C of the first embodiment as illustrated in FIG. 6D, and protective films 8, 9 are formed as in FIG. 1D to FIG. 1F to form the AlGaN/ GaN.FET.

In the AlGaN/GaN.FET according to this embodiment, the two-dimensional electron gas concentration in a second interface region 12 that is a portion corresponding to below the protective film 8 is lower than the two-dimensional electron gas concentration in a first interface region 11 that is a portion corresponding to below the protective film 9, between D-G as in the first embodiment. Accordingly, the sheet resistance directly below the protective film 8 (at a portion where the electron supply layer 3 is in contact with the protective film 8) is higher than the sheet resistance directly below the protective film 9 (at a portion where the electron supply layer 3 is in contact with the protective film 9).

Note that the gate electrode 7 may be formed to be more biased to the source electrode 43 side than to the drain electrode 44 as in the modified example 1 of the first embodiment also in this embodiment.

Alternatively, the protective film 8 may be formed to cover the gate electrode 7 from a predetermined point of the upper surface of the gate electrode 7 toward the drain electrode 6 side and extend to the vicinity of the gate electrode 7 on the electron supply layer 3 as in the modified example 2 of the first embodiment.

Alternatively, the gate 7 may be formed to be more biased to the source electrode 43 side than to the drain electrode 44 side and the protective film 8 may be formed to cover the gate electrode 7 from a predetermined point of the upper surface of the gate electrode 7 toward the drain electrode 44 side and extend to the vicinity of the gate electrode 7 on the electron supply layer 3 as in the modified example 3 of the first embodiment.

Alternatively, the protective film 8 may be formed to exist only on the cap layer 41 and come into contact with the bottom ends of the gate electrode 7 as in the second embodiment.

Alternatively, electron beams may be applied (or an element may be ion-implanted) to both sides (or only on the drain electrode 44 side) of the formation planned region for forming the gate electrode of the cap layer 41 to form depletion regions (or a depletion region) instead of forming the protective film 8 as in the third embodiment.

As described above, according to this embodiment, the gate leakage is significantly reduced by a relatively simple configuration to realize a highly-reliable AlGaN/GaN.FET achieving high-voltage operation, high withstand voltage, and high output.

Note that though the SiN film is exemplified as the protective films 8, 9 in the above-described first, second, and fourth embodiments and modified examples, for example, another insulating film, for example, $SiO_2$, $Al_2O_2$ or the like may be used as the protective films. In this case, it is conceivable not only to form the protective films 8, 9 using the same material but also to form the protective films 8, 9 using materials different from each other.

According to each of the above-described aspects, the gate leakage is significantly reduced by a relatively simple configuration to realize a compound semiconductor device achieving high-voltage operation, high withstand voltage, and high output.

According to the present embodiments, the gate leakage is significantly reduced by a relatively simple configuration to realize a highly-reliable compound semiconductor device achieving high-voltage operation, high withstand voltage, and high output.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a compound semiconductor device, the compound semiconductor device comprising:
    a substrate;
    an electron transit layer formed above the substrate;
    an electron supply layer formed above the electron transit layer; and
    a source electrode, a drain electrode, and a gate electrode formed between the source electrode and the drain electrode, which are formed above the electron supply layer,
    wherein a first insulating film is formed, at least, directly in contact with a first side surface of the drain electrode which faces the gate electrode and a second insulating film is formed, at least, directly in contact with a second side surface of the gate electrode which faces the drain electrode, and the first insulating film is not in contact with the second side surface, and
    wherein a two-dimensional electron gas concentration at a portion corresponding to below the second insulating film is made lower than a two-dimensional electron gas concentration at a portion corresponding to below the first insulating film between the electron transit layer and the electron supply layer.

2. The method of manufacturing a compound semiconductor device according to claim 1,
    wherein the second insulating film is formed to be higher in hydrogen concentration than the first insulating film.

3. The method of manufacturing a compound semiconductor device according to claim 1,
    wherein the second insulating film is formed by an input power higher than an input power for the first insulating film.

4. The method of manufacturing a compound semiconductor device according to claim 1,
    wherein an n-type GaN layer is formed between the source electrode and the drain electrode on the electron supply layer.

5. The method of manufacturing a compound semiconductor device according to claim 1,
    wherein the gate electrode is formed at a position more biased to the source electrode than to the drain electrode.

6. The method of manufacturing a compound semiconductor device according to claim 1,
    wherein each of the electron transit layer and the electron supply layer is made of a nitride semiconductor.

* * * * *